US005187647A

United States Patent [19]

Kaneko

[11] Patent Number: 5,187,647

[45] Date of Patent: Feb. 16, 1993

[54] ELECTRONIC INSTRUMENT KEYPAD ASSEMBLY WITH Z-AXIS ORIENTED ELECTRICAL INTERCONNECT

[75] Inventor: Steven T. Kaneko, Seattle, Wash.

[73] Assignee: John Fluke Mfg. Co., Inc., Everett, Wash.

[21] Appl. No.: 667,450

[22] Filed: Mar. 11, 1991

[51] Int. Cl.[5] ........................ H05K 1/14; H01H 13/70

[52] U.S. Cl. .................................. 361/413; 200/5 A; 361/412

[58] Field of Search ............. 200/5 A, 86 R, 512–517; 84/653; 361/397–400, 409, 412, 413, 414, 415

[56] References Cited

U.S. PATENT DOCUMENTS 3,699,294 10/1972 Sudduth ........................ 200/86 R X
4,050,756 9/1977 Moore ............................ 361/413 X
4,180,711 12/1979 Hirata et al. ........................ 200/5 A
4,217,473 8/1980 Parkinson ....................... 200/5 A X
4,532,575 7/1985 Suwa .................................. 361/413
4,570,521 2/1986 Fox ......................................... 84/653
4,602,135 7/1986 Phalen ................................ 200/5 A
4,640,994 2/1987 Komaki .............................. 200/5 A

*Primary Examiner*—J. R. Scott
*Attorney, Agent, or Firm*—Richard A. Koske; John Smith-Hill

[57] ABSTRACT

A keypad structure includes a stiff backing element and an elastomeric cover that have between them a first membrane on which is defined a shorting conductive layer, a second membrane on which is defined a main conductive layer, the second membrane on which the main conductive layer is defined as being adjacent the elastomeric cover rather than the stiff backing element as in the prior art. A third membrane provides spacing between the main and shorting conductive layers when the keypad is not compressed. An elastomeric interconnect can then be used to connect exposed contacts on the main conductive layer with other circuitry in an instrument utilizing the keypad.

20 Claims, 1 Drawing Sheet

ELECTRONIC INSTRUMENT KEYPAD ASSEMBLY WITH Z-AXIS ORIENTED ELECTRICAL INTERCONNECT

BACKGROUND OF THE INVENTION

This invention relates to keypads, and more particularly to instrument keypads that detect applied pressure by electrical contact between two membrane circuits that are normally spaced slightly apart.

FIG. 1 shows a prior art construction of a keypad based on two membrane circuits that are normally spaced slightly apart. The keypad is shown electrically connected to a circuit board 28. For clarity, the layers in this cross-sectional view have been shown spaced further apart than they actually are in an actual assembly.

An outer cover 10 of elastomeric material provides a suitable key appearance and tactile feedback when a finger applies pressure to one of the raised regions 12. Depressing the raised region 12 causes a thick spot 14 on the opposite surface of the cover 10 to contact a first membrane 16. A row of shorting conductors 18 on the bottom surface of the first membrane 16 is normally separated from transversely oriented rows of main conductors 22, 23 on a second membrane 24 by a third membrane 20. The third membrane 20 has cut-away areas in the vicinity of the rows of shorting conductors 18 that allow those rows of shorting conductors to make contact with the transversely oriented rows of main conductors 22, 23 on the second membrane 24 when the raised region 12 of the cover 10 is depressed. When the raised region 12 is not depressed, the thickness of the third membrane 20 and the stiffness of the first and second membranes 16 and 24 prevent contact between the shorting conductors 18 and the main conductors 22 and 23. A stiff backing element 26 provides a surface for the membrane layers 16, 20, 24 and their conductors 18, 22, 23 to be compressed against.

Referring now to FIG. 2, the rows of shorting conductors 18 on the first membrane are shown in their transverse relationship to rows of main conductors 22 and 23 on the second membrane. In this view, it can be seen that when the rows of shorting conductors 18 on the first membrane are pressed downward, they make contact with both rows of main conductors 22 and 23 on the second membrane, shorting them together. This electrical contact between the first set of main conductors 22 and the second set of main conductors 23 is detected by circuitry connected to extensions 22' and 23' of the main conductors 22 and 23.

Returning now to FIG. 1, the contact between the rows of conductors 18, 22 and 23 described above in connection with FIG. 2 must be communicated to circuitry (represented by conductors 30, 31) on a printed wiring board 28 so that other circuitry located there (not shown) can respond to key activity. Extensions 24' and 20' of the second membrane 24 and the third membrane 20, shield extensions 22' and 23' of the conductors 22 and 23 in what is known as a "tail". This "tail" must pass through a slot 25 in the stiff backing element 26, 26' and terminate in a male connector 32. This male connector 32 then must be mated with a female receptacle 33 on the printed wiring board 28, thereby bringing the main conductors 22 and 23 of the membrane assembly into contact with conductors 30 and 31 on the printed wiring board 28 via the extension conductors 22',23'.

While this prior art approach works, the need to fit the "tail" of the membrane assembly with the male connector 32, pass this male connector 32 and the "tail" of the membrane assembly through the slot 25 in the stiff backing member 26, 26', and then bend it down and around and into contact with the female receptacle 33 on the printed wiring board 28 creates undesirable manufacturing complexity.

In product designs optimized for manufacturability, especially highly automated methods of manufacture, "Z-axis assembly" principles are proving to be very important. Z-axis assembly simply means that a product is assembled by lowering the parts from above onto an existing sub-assembly. This is especially important in robotic assembly, but many of the same benefits can also be realized even in manual assembly. If automated assembly is being employed, the simplest and most cost effective parts handlers and other robotic machines can be employed to stack and connect parts to an existing sub-assembly quickly and easily if the product has been designed for Z-axis assembly.

With the foregoing in mind, the problem that arises in connection with the manufacturing of the prior art keypad shown in FIG. 1 can be better appreciated. The need to fit the extensions 24' and 20' of the membrane and the conductors 22' and 23' associated with them into the male connector 32, and then fit that male connector 32 through the slot 25 and down and around into contact with the female receptacle 33, violates the principle of Z-axis assembly and necessitates a human role in the product's manufacture.

What is desired is a structure and method for making keypads that eliminates the need for a membrane assembly "tail" or other jumper-like means of connection between the keypad and other circuitry in the instrument.

SUMMARY OF THE INVENTION

In accordance with the present invention, there is provided a keypad assembly structure in which the first and second membrane layers and their associated conductive layers are inverted in their orientation relative to the prior art (as shown in FIG. 1), so that an elastomeric interconnect can be used to provide the connection to the rest of the instrument and the membrane assembly "tail" or other jumper-like means can be eliminated.

According to one embodiment of the invention, a keypad structure containing a stiff backing element and an elastomeric cover has between these elements a first membrane on which is defined a shorting conductive layer, a second membrane on which is defined a main conductive layer, and a third membrane to provide spacing between the main and shorting conductive layers when the keypad is not compressed. The membrane on which the main conductive layer is defined is adjacent to the elastomeric cover, rather than the stiff backing element as in the prior art (as shown in FIG. 1). An elastomeric interconnect is used to connect exposed contacts on the main conductive layer with other circuitry in an instrument utilizing the keypad.

The subject matter of the present invention is particularly pointed out and distinctly claimed in the concluding portion of this specification. However, both the organization and method of operation, together with further advantages and objects thereof, may best be understood by reference to the following detailed description and accompanying drawings.

DETAILED DESCRIPTION

Figure 1:
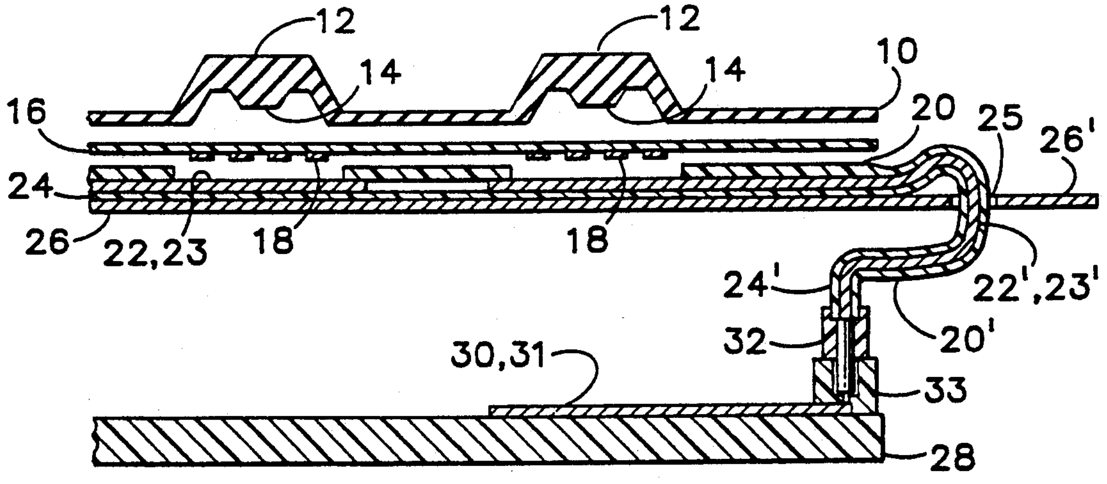
FIG. 1 (PRIOR ART)
FIG. 1 is a cross-sectional view of a prior art keypad construction.
Figure 2:
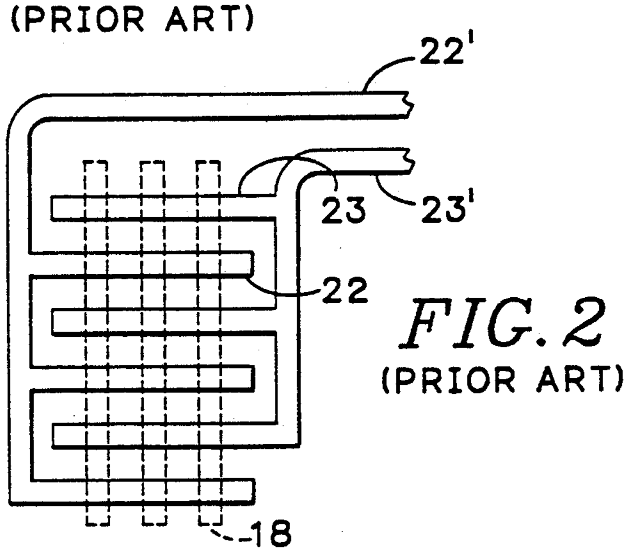
FIG. 2 (PRIOR ART)
FIG. 2 is a top view of the arrangement of conductors in the prior art keypad of FIG. 1.
Figure 3:
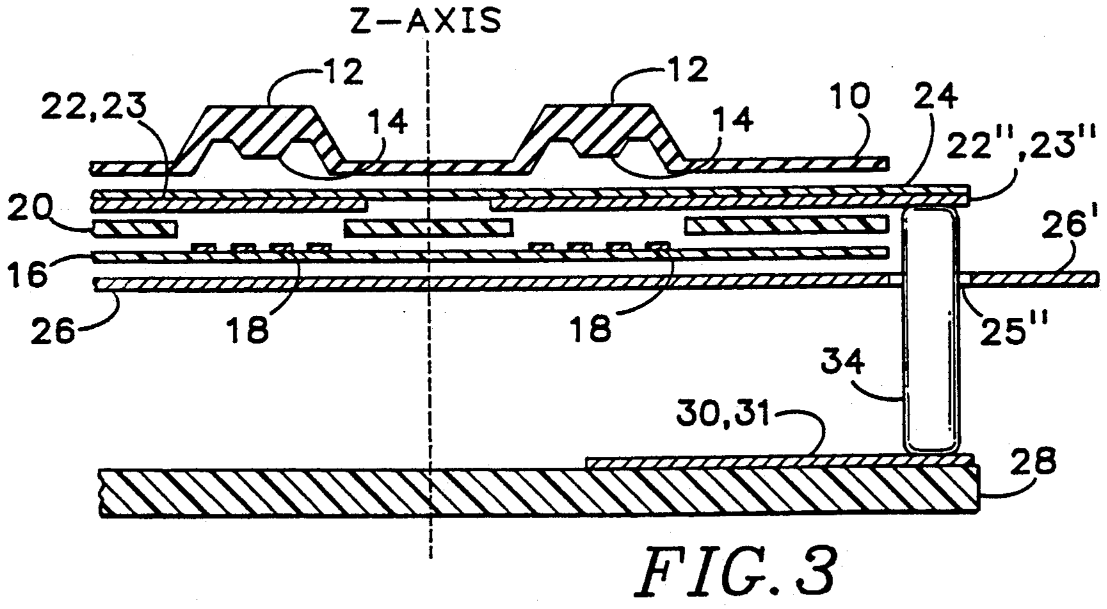
FIG. 3 is a cross-sectional view of an improved keypad according to the present invention.

Referring to FIG. 3, an improved keypad according to the present invention is shown in cross-sectional view. In this keypad, the location and orientation of the first and second membranes 16 and 24, and the conductive layers 18 and 22 defined on them, have been reversed relative to their arrangement in the prior art shown in FIG. 1. This reversal of orientation eliminates the need for membrane extension or other jumper-like means by permitting a direct connector, such as an elastomeric interconnect 34, to be used to connect the exposed conductors 22″ and 23″ on the second membrane 24 to other circuitry 30 and 31 in the instrument. A first end of the elastomeric interconnect is in pressure contact with the exposed conductors while a second end of the interconnect is in pressure contact with the other circuitry in the instrument.

The three membrane layers 16, 20 and 24 and the conductive layers 18 and 22 defined on two of them, along with adhesive layers to hold them together, can be purchased as a unit. In one embodiment, the membrane layers 16, 20 and 24 are each about 0.005 inch (0.127 mm) thick, for an overall maximum thickness, including adhesive layers, of less than 0.020 inch (0.508 mm). The membrane layers are preferably formed of polyester.

While not central to the invention, the elastomeric cover 10 with its raised regions 12 and thick spots 14, adds visual and tactile feedback that many users prefer. In an alternative embodiment, the top surface of the membrane layer 24 on which the main conductive layer 22 is defined could be used directly, with suitable markings, as the keypad input.

While a preferred embodiment of the present invention has been shown and described, it will be apparent to those skilled in the art that many changes and modifications may be made without departing from the invention in its broader aspects. For example, the spacing between the main conductors and the shorting conductors could be provided by some spacing means other than a membrane layer. The claims that follow are therefore intended to cover all such changes and modifications as fall within the true scope of the invention.

What is claimed is:

1. A keypad comprising:

a stiff backing element having first and second opposite sides;

a first membrane layer disposed at the first side of the stiff backing element, a first side of the first membrane layer confronting the stiff backing element, a second side of the first membrane layer having shorting circuitry defined thereon;

spacing means, a first side of the spacing means confronting the second side of the first membrane layer, the spacing means defining apertures in the vicinity of the shorting circuitry;

a second membrane layer, said second membrane layer being flexible and adapted for being depressed on a first side thereof, a second side of the second membrane layer confronting the spacing means and having a first portion of main circuitry defined thereon, the main circuitry including an exposed second portion, said first portion of the main circuitry being substantially coextensive with said shorting circuitry for contacting said shorting circuitry when said flexible membrane layer is depressed; and a conductive interconnector in direct contact with said exposed second portion of the main circuitry and separate from said second membrane layer for connecting said main circuitry to circuitry external to the keypad and disposed at the second side of said stiff backing element, said interconnector extending at least to said second side of said stiff backing element so as to be adapted for Z-axis assembly.

2. A keypad according to claim 1 wherein the spacing means comprises a third membrane layer.

3. A keypad according to claim 1 further comprising an elastomeric cover with a first side confronting the first side of the second membrane layer, the elastomeric cover including a key defining marking disposed on a second side corresponding in location to the shorting circuitry.

4. A keypad according to claim 3 wherein the elastomeric cover further comprises:

a raised region corresponding in location to the key defining marking; and a thick spot corresponding in location to the raised region.

5. A keypad according to claim 1 wherein said stiff backing element has an opening therethrough and said interconnector extends through said opening.

6. A keypad according to claim 5 wherein said interconnector comprises an elastomeric interconnector.

7. A keypad according to claim 1 wherein said interconnector comprises an elastomeric interconnector.

8. A keypad comprising:

a stiff backing element having first and second opposite sides;

a first membrane layer disposed at the first side of the stiff backing element, a first side of the first membrane layer confronting the stiff backing element, a second side of the first membrane layer having shorting circuitry defined thereon;

spacing means, a first side of the spacing means confronting the second side of the first membrane layer, the spacing means defining apertures in the vicinity of the shorting circuitry;

a second membrane layer, said second membrane layer being flexible and adapted for being depressed on a first side thereof, a second side of the second membrane layer confronting the spacing means and having a first portion of main circuitry defined thereon, the main circuitry including an exposed second portion, said first portion of the main circuitry being substantially coextensive with said shorting circuitry for contacting said shorting circuitry when said flexible membrane layer is depressed; and a conductive interconnector in pressure contact with said exposed second portion of the main circuitry for connecting said main circuitry to circuitry external to the keypad and disposed at the second side of said stiff backing element, said interconnector extending at least to said second side of said stiff backing element so as to be adapted for Z-axis assembly.

9. A keypad according to claim 8 wherein the spacing means comprises a third membrane layer.

10. A keypad according to claim 8 further comprising an elastomeric cover with a first side confronting the first side of the second membrane layer, the elastomeric cover including a key defining marking disposed on a second side corresponding in location to the shorting circuitry.

11. A keypad according to claim 10 wherein the elastomeric cover further comprises:

a raised region corresponding in location to the key defining marking; and a thick spot corresponding in location to the raised region.

12. A keypad according to claim 8 wherein said stiff backing element has an opening therethrough and said interconnector extends through said opening.

13. A keypad according to claim 12 wherein said interconnector comprises an elastomeric interconnector.

14. A keypad according to claim 8 wherein said interconnector comprises an elastomeric interconnector.

15. An electronic instrument comprising:

a keypad comprising:

a stiff backing element having an opening therein;

a first membrane layer, a first side of the first membrane layer confronting the stiff backing element, a second side of the first membrane layer having shorting circuitry defined thereon;

spacing means, a first side of the spacing means confronting the second side of the first membrane layer, the spacing means defining apertures in the vicinity of the shorting circuitry; and a second membrane layer, a first side of the second membrane layer confronting the spacing means and having main circuitry defined thereon, the main circuitry including an exposed portion for connection to circuitry external to the keypad;

and the instrument further comprising:

a substrate having first and second faces;

electronic circuitry defined on a first face of said substrate, said electronic circuitry having at least one exposed electrical connection; and a conductive interconnector disposed to connect said exposed portion of the main circuitry to said at least one electrical connection on the substrate and extending through said opening so as to be adapted for Z-axis assembly.

16. An electronic instrument according to claim 15 wherein the spacing means comprises a third membrane layer.

17. An electronic instrument according to claim 15 further comprising an elastomeric cover adjacent a second side of the second membrane layer, the elastomeric cover including a key defining marking on a surface thereof corresponding in location to the shorting circuitry.

18. An electronic instrument according to claim 17 wherein the elastomeric cover further comprises:

a raised region corresponding in location to the key defining marking; and a thick spot corresponding in location to the raised region.

19. An electronic instrument according to claim 15 wherein the interconnector comprises an elastomeric interconnect member, said elastomeric interconnect member extending from said electronic circuitry, through said stiff backing element to said exposed portion of said main circuitry.

20. An electronic instrument according to claim 15 wherein the interconnector comprises a conductive elastomeric interconnect member, said elastomeric interconnect member extending from said electronic circuitry, through said stiff backing element to said exposed portion of said main circuitry and being in pressure contact with said electronic circuitry and said main circuitry.

* * * * *